United States Patent
Baader et al.

(10) Patent No.: US 6,892,364 B2
(45) Date of Patent: May 10, 2005

(54) METHOD OF ANALYZING AN INTEGRATED ELECTRIC CIRCUIT, COMPUTER PROGRAM UTILIZING THE METHOD, DATA CARRIER INCLUDING THE METHOD, AND METHOD FOR DOWNLOADING THE PROGRAM

(75) Inventors: Peter Baader, München (DE); Ludwig Burkhard, München (DE)

(73) Assignee: Infineon Technologies AG, Munich (DE)

( * ) Notice: Subject to any disclaimer, the term of this patent is extended or adjusted under 35 U.S.C. 154(b) by 217 days.

(21) Appl. No.: 10/215,453

(22) Filed: Aug. 9, 2002

(65) Prior Publication Data

US 2003/0030445 A1 Feb. 13, 2003

(30) Foreign Application Priority Data

Aug. 9, 2001 (DE) .......................................... 101 38 142

(51) Int. Cl.[7] .............................................. G06F 17/50
(52) U.S. Cl. ................................... 716/4; 716/5; 716/6
(58) Field of Search ................................ 716/4, 5, 6, 1, 716/2–21

(56) References Cited

U.S. PATENT DOCUMENTS 5,544,067 A * 8/1996 Rostoker et al. .............. 703/14
5,754,441 A * 5/1998 Tokunoh et al. ............... 716/11
6,292,927 B1 * 9/2001 Gopisetty et al. .............. 716/11
6,308,308 B1 * 10/2001 Cronin et al. ................... 716/8
6,393,333 B1 * 5/2002 Okumura ..................... 700/114
6,711,731 B2 * 3/2004 Weiss ........................... 716/19
2002/0138817 A1 * 9/2002 Lee et al. ...................... 716/12
2003/0135835 A1 * 7/2003 Komaki ........................ 716/10

OTHER PUBLICATIONS

Heineken, H.T. et al.: "CAD At The Design–Manufacturing Interface", ACM 1997, pp. 321–326.

Maly, W. et al.: "Detection Of An Antenna Effect in VLSI Designs", IEEE 1996, pp. 86–94.

Guruswamy, R. et al.: "CELLERITY: A Fully Automatic Layout Synthesis System for Standard Cell Libraries", DAC 1997, pp. 327–332.

* cited by examiner

Primary Examiner—Vuthe Siek
Assistant Examiner—Magid Y. Dimyan
(74) Attorney, Agent, or Firm—Laurence A. Greenberg; Werner H. Stemer; Ralph E. Locher

(57) ABSTRACT

An integrated electric circuit includes one or more circuit networks each having a large number of circuit elements. Images of circuit networks are produced on a computer system and checked for correctness by using predefined testing rules. Those images are marked in which at least one fault is determined. The information obtained in this way is output.

26 Claims, 6 Drawing Sheets

METHOD OF ANALYZING AN INTEGRATED ELECTRIC CIRCUIT, COMPUTER PROGRAM UTILIZING THE METHOD, DATA CARRIER INCLUDING THE METHOD, AND METHOD FOR DOWNLOADING THE PROGRAM

BACKGROUND OF THE INVENTION

Field of the Invention

The invention relates to a method of analyzing an integrated electric circuit including one or more circuit networks, each having a large number of circuit elements. In this method, integrated electric circuits are investigated for faults that are caused by the fabrication process or by the construction of the integrated electric circuit.

In the prior art, methods of finding faults caused by the fabrication process are known, in which integrated electric circuits are checked with proprietary manufacturer-specific "design-rule check" rules or "DRC" rules. Furthermore, methods are known in which structural protective structures are incorporated intuitively by the designer of an electric circuit and, in particular, transistors are supplemented appropriately with "tie-down" diodes if necessary.

These methods are inadequate at discovering formally correct integrated electric circuits that have faulty circuit elements as a result of individual fabrication steps and/or as a result of the sequence of fabrication steps in the production process. In particular, these methods do not fully detect faulty transistors.

In the known methods of checking integrated electric circuits with "DRC" rules, these methods are associated with very high run times. Or, for highly-complex integrated electric circuits, they cannot be applied. Furthermore, these methods are proprietary and manufacturer-specific. Therefore, they are limited to their relevant system.

In the case in which the integrated electric circuits are supplemented manually with protective structures against faults caused by the fabrication process, it is disadvantageous that these methods prove to be insufficiently reliable and that inevitably faults are overlooked. Furthermore, such methods are very time-consuming.

Furthermore, methods, in particular test programs, are known for discovering high-resistance circuit elements that are connected to a plurality of circuit networks. These methods check the integrated electric circuits for faulty circuit elements by inserting "soft connects".

In these methods, it is disadvantageous that additional "connectivity" or conductivity is inserted into the relevant integrated electric circuits, and work is not carried out with the original "connectivity".

SUMMARY OF THE INVENTION

It is accordingly an object of the invention to provide a method of analyzing an integrated electric circuit, a computer program utilizing the method, a data carrier including the method, and a method for downloading the program that overcome the hereinafore-mentioned disadvantages of the heretofore-known devices and methods of this general type and that uncovers faults during the fabrication of integrated electric circuits, and lowers the reject rate in the production of integrated electric circuits.

With the foregoing and other objects in view, there is provided, in accordance with the invention, a method for analyzing integrated electric circuits. The method includes the following steps:

a) providing a circuit network having circuit elements, the circuit elements being determined by form, property information, and position information selected from the group including absolute position and relative position within the circuit network; the form, property information, and position information being stored in at least a part of a file on a storage unit of a computer system, and the circuit elements of the integrated electric circuit being produced serially in a production including successive production steps;

b) selecting at least a part of the circuit network;

c) producing an image of the at least a part of the circuit network selected in step b) on the computer system, from the information stored in the storage unit regarding the circuit elements of the at least part of the circuit network;

d) producing on the computer system at least one circuit-network image of at least one new circuit network by starting from the produced image from step c) of the at least part of the circuit network and omitting information about circuit elements being produced in a same production step and in successive production steps of the production process;

e) checking the at least one circuit-network image produced in step d) of the circuit networks for correctness by using predefined testing rules to determine faults; and f) individually marking the at least one circuit-network image when the at least one circuit-network image contains a fault determined in step e).

With the objects of the invention in view, there is also provided a program that executes the above-described method.

With the objects of the invention in view, there is also provided a data carrier that stores the above described program.

With the objects of the invention in view, there is also provided a method for delivering the program. The method includes downloading the above-described computer program from an electronic data network onto a computer connected to the electronic data network.

According to the invention, an integrated electric circuit includes one or more circuit networks, each having a large number of circuit elements. The circuit elements are determined by form and property information. A complete integrated electric circuit is characterized by the circuit elements contained in it and by the information about their absolute and/or about their relative position.

This information is disposed in at least one file or in at least one part of a file on a storage unit of a computer system. In this case, preferably one file is in each case provided for each circuit element. Furthermore, in each case one file with information for each circuit network or for each electric circuit is advantageously provided.

The circuit elements of an integrated electric circuit are produced one after another by a large number of successive production steps. The circuit elements are present in each case on one level or layer of the integrated electric circuit, integrated electric circuits extending on a plurality of levels or layers.

In the method according to the invention, in a first step, a circuit network or a part of a circuit network is selected. All the circuit networks of an integrated electric circuit are checked one after another by the method according to the invention.

Here, in each case a start is made from a hierarchically highest circuit network. From the information present on the storage unit, an image of this circuit network or this part of the circuit network is then produced on the computer system. This is followed by the selection of a production step or a plurality of specific production steps of the production process and, accordingly, specific layers or levels of the integrated electric circuit by a user or by the computer program.

Then, a new image is produced from the existing image, by information being left out about those circuit elements which are produced in the selected fabrication step or in the selected fabrication steps. In a further step, the images produced in this way of the circuit networks are checked for correctness by using predefined testing rules and those images are marked in which a fault is determined. The testing rules have information about specific circuit elements or about one or more combinations of circuit elements, with which the produced image of the circuit network is compared.

If, as a result of the comparison of the image of the circuit network with these testing rules, a fault is detected, then the faulty circuit network is output, as is further information going beyond this.

A basic idea of the invention is to permit simulation or modeling of formally correct integrated electric circuits on a computer system, faults that are caused by individual production steps and by the sequence of production steps being identified. The method of the invention allows manufacturer-independent modeling and checking of integrated electric circuits in relation to any desired fabrication step is made possible. Therefore, structural analysis of the relevant integrated electric circuit is provided.

A further basic idea of the invention is to provide simulation or modeling of integrated electric circuits having faulty circuit elements on a computer system, these faulty circuit elements within the integrated electric circuits being identified unambiguously. The method according to the invention allows manufacturer-independent modeling and can checks integrated electric circuits for faulty circuit elements and/or levels or layers; desired levels or layers of the integrated electric circuits can be eliminated. As a result, structural analysis of the relevant integrated electric circuit is possible.

The method of the invention is based on a "layout versus schematic-clean" extraction or on a "LVS-clean" extraction. Thus, the extracted circuit network that is checked is exactly that which was produced by the technology runset. Furthermore, the method is manufacturer-independent and can in principle be based on any extraction if an interface is provided to the extracted information stored on the storage unit of the computer system and relating to the integrated electric circuits and to the individual circuit elements. In this case, extraction is understood to mean the production of an image of an integrated electric circuit on the computer system from stored information.

The method according to the invention operates completely hierarchically. Flexible runset control permits modeling of every extracted circuit network, as desired. In subtractive terms, any desired levels or layers and polygons or circuit elements can be removed and, in this way, the electrical and physical modeling of specific states can be achieved.

Following a runset change, repeated checking can be carried out on the same database without repeating the extraction.

In practice, there are often integrated electric circuits that are formally correctly constructed but whose function does not agree exactly with the specification. This is often caused by faults during the production process. These faults are particularly difficult to identify by the known methods. According to the invention, a method reliably detects such faults in the production process and corrects them by running a simulation on a computer system.

Furthermore, integrated electric circuits that include circuit elements that are faulty and deviate from the specification are known from practice. These often not excessively large deviations of individual circuit elements with respect to the specification are particularly difficult to identify by the known methods. According to the invention, then, a method is available with which, very advantageously and very reliably, such faulty circuit elements can be detected and corrected by running a simulation on a computer system.

According to one embodiment of the invention, the step of producing one or more images by leaving out the information about circuit elements produced in the same production step or in a plurality of successive production steps, the step of checking the images produced in this way for correctness, and the step of marking all the faulty circuit networks and outputting the information obtained in this way for fault-free images of the circuit networks are repeated. This recursive repetition is carried out until either a fault is found or until the lowest hierarchical stage has been reached.

In the production of an image of a new coherent circuit network or a plurality of images of new mutually separate circuit networks on the computer system, the starting point is the respectively last produced image of the circuit network or the respectively last produced part of a circuit network. The new images of circuit networks are formed from the existing image in each case by leaving out circuit elements that are produced in the respectively next or in the respectively preceding fabrication step or steps. In the case in which, as a result of the removal of circuit elements, the image of the circuit network is no longer of coherent construction, the aforementioned method steps are run through separately for the separate regions of the images of the circuit networks that are produced.

This embodiment of the invention enables automatic analysis of integrated electric circuits. In automatic analysis, the fabrication steps are modeled in accordance with their chronological sequence. In this case, it is also conceivable for a different sequence of the fabrication steps to be envisaged by a user. This embodiment of the invention checks an integrated electric circuit, starting at the hierarchically highest circuit network and finishing with the lowest hierarchical stage. This checking yields a particularly comprehensive and particularly reliable result about the serviceability of the checked integrated electric circuit.

According to a further embodiment of the invention, images of faulty circuit networks are automatically improved by using predefined correction rules. Such correction rules may be present as form and property information about individual circuit elements and about combinations of circuit elements. Accordingly, automatic correction of faulty parts of the integrated electric circuit is particularly advantageously made possible.

According to a further embodiment of the invention, the testing rules include the checking of the respective image of the integrated electric circuit for the presence of a "tie-down" diode. In this case, the exact position at which the "tie-down" diode is missing is reported. During the checking for the presence of a "tie-down" diode, the electric charge that occurs during the fabrication is grounded via the "tie-down" diode. This prevents gates of transistors in the respective circuit networks being destroyed.

This is because, in the production process of integrated electric circuits, the problem arises that specific layers, in particular metallic layers, are charged up electrically. When circuit elements of such metallic layers are connected to the gate of a transistor, directly or via one or more further metallic circuit elements, without there being a "tie-down" diode, then there is often a current flow between the respective metallic circuit elements and the gate of the transistor. This can destroy the transistor and therefore make the entire integrated electric circuit unusable.

Furthermore, images of the integrated electric circuits can be checked for faults caused by the production process by using "antenna checks".

In this case, a check is made as to whether specific predefined area relationships between individual polygon areas, in particular between the area of the transistor gate and between the area of the metal polygons which are connected to the relevant transistor gate are satisfied.

If the area of the relevant metal polygon is relatively small as compared with the area of the transistor gate connected to the metal polygon, then no destruction of the transistor occurs. In this case, the respectively relevant metal polygon and the transistor gate are checked as fault-free. In the event of deviations of the polygons from the predefined area relationships, these polygons are detected as faulty. This embodiment of the invention can find simply and reliably faults in integrated electric circuits caused by the production process.

According to a further embodiment of the invention, in the case in which an image of a faulty circuit network that has no "tie-down" diode was marked, this "tie-down" diode is automatically added in the image of the relevant circuit network. In this case, either the metallic circuit element that is present at the hierarchically highest level, or that metallic circuit element which has a direct contact with the relevant gate of the transistor, is connected to a "tie-down" diode.

Furthermore, faults in the integrated electric circuits can be corrected automatically if they have been detected and localized by "antenna checks".

Therefore, automated correction of the faulty parts of the integrated electric circuit is particularly advantageously provided.

The data structure of the integrated electric circuit is preferably stored fully hierarchically.

According to a further embodiment of the invention, the testing rules for checking the produced images of the circuit networks for correctness test whether the produced image of the new circuit network is coherent or whether the produced image is broken up into a plurality of mutually separate circuit networks.

If a plurality of images of new mutually separate circuit networks has been produced, the checking supplies a faulty result. If the image produced has a new coherent circuit network, then the check yields a correct result.

Therefore, the method determines the circuit elements or polygons via which various regions of circuit networks are exclusively connected. These circuit elements, which represent the sole connection between various regions of circuit networks, are particularly critical for the smooth functioning of the overall integrated electric circuit.

This embodiment of the invention can identify such circuit elements particularly simply and particularly reliably.

According to a further embodiment of the invention, for the case in which exactly one image of a new coherent circuit network is produced on the computer system, the step of the production of one or more images of circuit networks on the computer system is repeated. The step of checking the produced images for correctness by using predefined testing rules and the step of marking all the images of the circuit networks in which a fault is detected and also the output of the information is obtained in this way.

This repetition is carried out until either a plurality of images of separate circuit networks are produced and the circuit network examined has therefore been broken down, or until no further circuit elements are selected, and therefore no new images of circuit networks are produced on the computer system.

In this case, the circuit elements, which are in each case left out during a repetition of the method steps listed above, can be selected by a user or by a computer program. In this case, preferably, complete layers or levels of the integrated electric circuit to be checked can be selected and eliminated one after another from the respective image of the circuit network.

Therefore, circuit networks can be simulated in a particularly user-friendly and particularly simple way, in which circuit elements are left out systematically one after another.

According to a further embodiment of the invention, in the case in which a plurality of images of new mutually separate circuit networks has been produced and the circuit network has therefore been broken down, those circuit elements whose information was left out last are corrected automatically.

In this case, correction rules are provided that may be present as form and property information about individual circuit elements and about combinations of circuit elements. Such correction rules automatically replace circuit elements in which leaving out information leads to the breakdown of the circuit network.

According to a further embodiment of the invention, the production of one or more images of circuit networks on the computer system is carried out by starting from the produced image of the circuit network or from the produced part of the circuit network by information being left out about circuit elements that have a high electrical resistance. These circuit elements are preferably produced in the same production step or in a sequence of a plurality of production steps of the production process.

This embodiment of the invention can find faulty circuit elements in an integrated electric circuit that have a resistance greater than that specified. Such circuit elements, which are difficult to find by the methods applied in practice, are often responsible for specific parts of integrated electric circuits, such as in particular transistors, not functioning as desired. The particularly critical situation in which various regions of integrated electric circuits are connected exclusively via circuit elements that have faulty electric resistances can be detected particularly beneficially by the present embodiment of the invention.

According to a further embodiment of the invention, these high-resistance circuit elements that are found are corrected automatically. During this automatic correction, these circuit elements are replaced by other circuit elements that have a respectively lower electrical resistance.

This possibility of automatic correction of circuit elements that have too high an electrical resistance and that represent the sole connection between different regions of circuit networks constitutes a particularly advantageous development of the method according to the invention.

According to a further embodiment of the invention, the production of one or more images of circuit networks, starting from the produced image of the circuit network or from the produced part of the circuit network on the computer system is provided. In this case, information is omitted about circuit elements that include polysilicon and are produced in the same production step or in a plurality of successive production steps.

Accordingly, it is particularly advantageous to identify circuit elements that represent the sole connection between various regions of circuit networks and which include high-resistance polysilicon. During the extraction of circuit networks, no differentiation is made with regard to the extremely different conductivity of circuit elements. For example, no fault is output if, instead of a very highly conductive circuit element made of metal, a circuit element made of polysilicon, which conducts less well, is provided.

This embodiment of the invention can find reliably circuit elements made of polysilicon that are wrongly disposed at positions within the integrated electric circuit, which are provided for circuit elements made of metal.

According to a further embodiment of the invention, these circuit elements made of polysilicon that are found are replaced by circuit elements made from metal. Accordingly, particularly advantageous automatic improvement of faulty circuit elements is carried out.

The invention is also implemented in a computer program for carrying out a method of analyzing an integrated electric circuit. Here, the computer program is written in such a way that, following the selection of an integrated electric circuit or part of an integrated electric circuit, a method as claimed in one of the claims can be carried out. In this case, the result of the method is information about the correctness or about the faults in the integrated electric circuit or part of the integrated electric circuit can be output.

The result of the improved computer program according to the invention is simple and effective checking of integrated electric circuits and an improvement in the run time as compared with the known methods of analyzing integrated electric circuits.

The invention also relates to a computer program that is contained on a storage medium, stored in a computer memory, contained in a direct access memory, or transmitted on an electric carrier signal.

Furthermore, the invention relates to a data carrier having such a computer program and a method in which such a computer program is downloaded from an electronic data network, such as from the Internet, onto a computer connected to the data network.

The method according to the invention can be implemented in a computer program such as that sold under the tradename HERC. It can be run on the databases of an extraction tool, such as those sold under the tradename SALVE from INFINEON® and VAMPRIE/ASSURA from CADENCE. An interface to the "annotated GDS" can be implemented. The "annotated GDS" is a file that includes geometric information relating to the individual polygons or circuit elements and to circuit networks of integrated electric circuits.

With this invention, signal nodes relating to any desired fabrication step can be modeled. These can be subjected to subsequent structural analysis.

In particular, conductive components can be used for the method of the invention. The precise sequence of the method of the invention can be specified by the user by using a "runset".

The method of the invention for finding a plurality of images of mutually separate circuit networks on the computer system operates "bottom-up" on the fully hierarchical structure of the circuit networks. The method of the invention is accordingly based on a conventional "layout versus schematic-clean" extraction, that is to say exactly on the image of the integrated electric circuit as described by the technology.

During the hierarchical production of images of circuit networks on the computer system, the procedure can be such that all the circuit elements that are connected to the same circuit element in one image of a circuit network are combined. This step is done "bottom-up" and determines the minimum number of circuit elements.

In summary, the idea of the invention is based on examining the "connectivity" of a normally extracted integrated electric circuit. In this case, the procedure is such that circuit networks connected via high-resistance circuit elements or levels are searched by these circuit elements or networks subsequently being considered as insulating. At the same time, an examination is made to see whether a circuit network breaks down into separate circuit networks under these conditions.

Other features which are considered as characteristic for the invention are set forth in the appended claims.

Although the invention is illustrated and described herein as embodied in a method of analyzing an integrated electric circuit, a computer program utilizing the method, a data carrier including the method, and a method for downloading the program, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
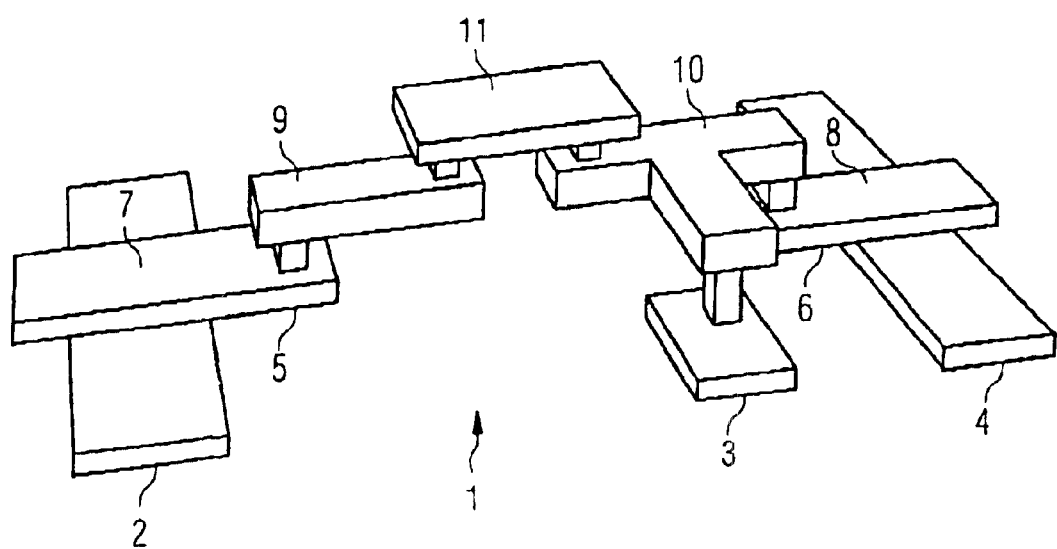
FIG. 1 is a schematic perspective view of a first integrated electric circuit according to a first embodiment of the invention.

Referring now to the figures of the drawings in detail and first, particularly to FIG. 1 thereof, there is shown a schematic three-dimensional representation of a first integrated electric circuit 1 according to a first exemplary embodiment.

The representation of the first integrated electric circuit 1, shown in FIG. 1, is an image simulated on a computer system of an integrated electric circuit that is really present.

The first integrated electric circuit 1 is divided into a first diffusion layer polygon 2, into a second diffusion layer polygon 3, into a third diffusion layer polygon 4, into a first polysilicon layer polygon 5, into a second polysilicon layer polygon 6, into a first transistor gate 7, into a second transistor gate 8, into a first metal layer polygon 9, into a second metal layer polygon 10, and into a third metal layer polygon 11.

The first integrated electric circuit 1, shown in the present first exemplary embodiment, constitutes a circuit that is simplified substantially, for illustrative reasons, as compared with a real integrated electric circuit.

The first integrated electric circuit 1 includes a diffusion layer, a polysilicon layer, a first metal layer, and a second metal layer. These layers are disposed one above another in a plurality of levels. In the present exemplary embodiment, the diffusion layer is disposed at the bottom. The polysilicon layer is located on the level above the diffusion layer. The first metal layer is provided on the next higher levels. The second metal layer is disposed on the top level of the four levels according to the invention.

The polygons of the same layer are in each case produced in the same fabrication step. The individual layers are produced one after another, the production sequence provided being as follows: diffusion layer, polysilicon layer, first metal layer, and second metal layer.

The first diffusion layer polygon 2, the second diffusion layer polygon 3, and the third diffusion layer polygon 4 are present on the diffusion layer. The first polysilicon layer polygon 5 and the second polysilicon layer polygon 6 are present on the polysilicon layer. A square region of the first polysilicon layer polygon 5 lies flat on the first diffusion layer polygon 2. The square contact-area layer between the first diffusion layer polygon 2 and the first polysilicon layer polygon 5 forms the first transistor gate 7. A likewise square region of the second polysilicon layer polygon 6 lies flat on the third diffusion layer polygon 4. The square contact-area layer between the third diffusion layer polygon 4 and the second polysilicon layer polygon 6 forms the second transistor gate 8.

The first metal layer polygon 9 and the second metal layer polygon 10 are disposed on a first metal level. The first metal layer polygon 9 is connected to the first polysilicon layer polygon 5 via a contact. The second metal layer polygon 10 is connected to the second diffusion layer polygon 3 by a contact, and to the second polysilicon layer polygon 6 by a further contact. The connection between the second metal layer polygon 10 and the second diffusion layer polygon 3 constitutes a "tie-down" diode, as it is known. The third metal layer polygon 11 is disposed on the second metal level. The third metal layer polygon 11 is connected to the first metal layer polygon 9 and to the second metal layer polygon 10 by a contact in each case.

According to the invention, information about the form and the size of the individual polygons or circuit elements is stored in the form of numeric data on a storage unit, not shown here, of a computer system. This information is preferably stored in respectively separate files.

Information about integrated electric circuits including one or more circuit networks is likewise stored in files on the storage unit of the computer system. This information includes the circuit elements contained in the relevant integrated electric circuit, and also statements about their absolute, and/or relative position within the integrated electric circuit.

In the present exemplary embodiment, the form and size information relating to the first diffusion layer polygon 2, to the second diffusion layer polygon 3, to the third diffusion layer polygon 4, to the first polysilicon layer polygon 5, to the second polysilicon layer polygon 6, to the first transistor gate 7, to the second transistor gate 8, to the first metal layer polygon 9, to the second metal layer polygon 10, and to the third metal layer polygon 11 is stored in respectively separate files on the computer system, not shown here.

The statements that describe the construction of the first integrated electric circuit 1 by using the polygons contained and their absolute and relative position is stored, in the present exemplary embodiment, in a separate file on the computer system.

The polygons of the first integrated electric circuit 1 are fabricated one after another in a production process by using a large number of successive production steps. The information as to in which fabrication steps the individual polygons are produced, and the information about the chronological processing of the fabrication steps, is likewise stored in the storage unit of the computer system.

The representation of the first integrated electric circuit 1 in FIG. 1 represents an image of the real integrated electric circuit after complete passage through all the fabrication steps of the production process. It is therefore the image of a finished and formally serviceable integrated electric circuit.

Figure 2:
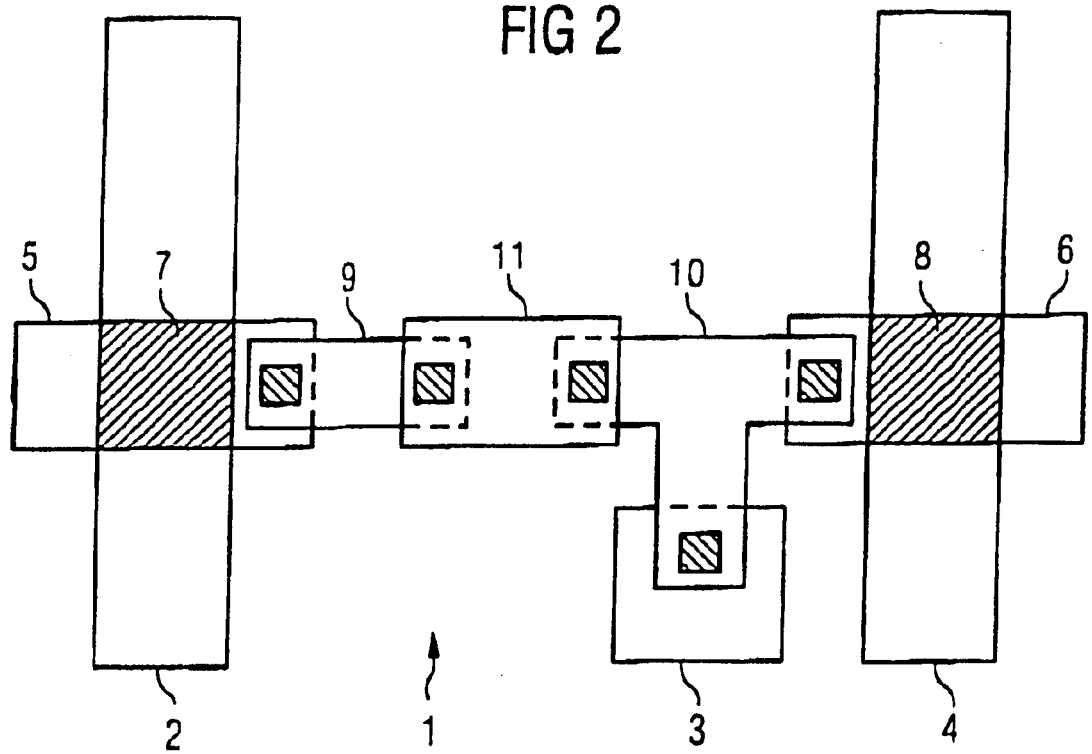
FIG. 2 is a plan view of the first integrated electric circuit according to the first embodiment shown in FIG. 1.

FIG. 2 shows a schematic two-dimensional representation of a plan view of the first integrated electric circuit 1, shown in FIG. 1, according to the first exemplary embodiment.

The polygons of the first integrated electric circuit 1 and their configuration within the first integrated electric circuit 1 correspond to the description in FIG. 1. In the plan view illustrated in FIG. 2 of the first integrated electric circuit 1, the first transistor gate 7 and the second transistor gate 8 are shown hatched. The contacts between the polysilicon layer polygon 5, the first metal layer polygon 9, the third metal layer polygon 11, the second metal layer polygon 10, the second diffusion layer polygon 3, and the second polysilicon layer polygon 6 are identified by small squares.

The representation of the first integrated electric circuit 1 in FIG. 2 constitutes an image of the real integrated electric circuit after complete passage through all the fabrication steps of the production process. It is therefore an image of a finished and formally serviceable integrated electric circuit.

Figure 3:
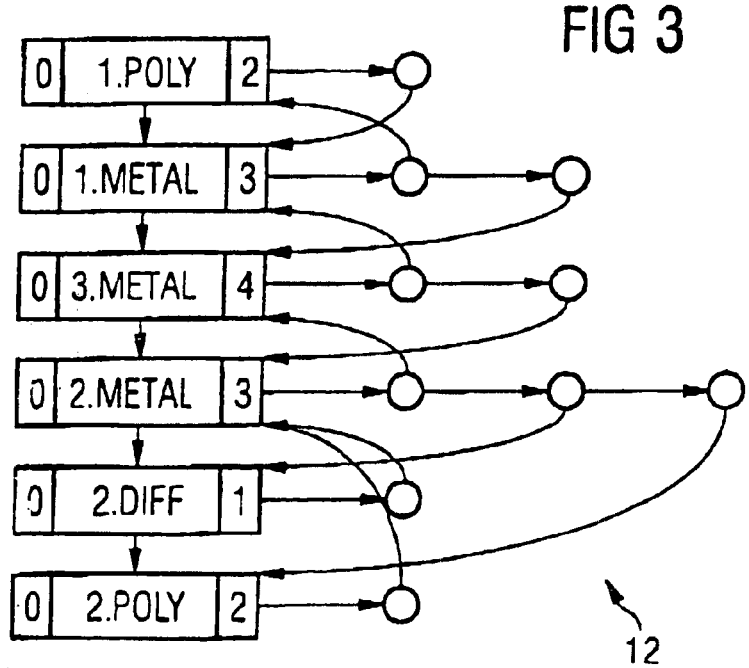
FIG. 3 is a schematic representation of a first polygon data structure of the first integrated electric circuit according to the first embodiment shown in FIGS. 1 and 2.

FIG. 3 shows a schematic representation of a first polygon data structure 12 of the first integrated electric circuit 1, shown in FIG. 1 and in FIG. 2, according to the first exemplary embodiment.

The representation of information of the first polygon data structure 12 is divided into a representation of information about the second diffusion layer polygon 3 of the diffusion layer, about the first polysilicon layer polygon 5 and about the second polysilicon layer polygon 6 of the polysilicon layer, about the first metal layer polygon 9 and about the second metal layer polygon 10 of the first metal layer, and about the third metal layer polygon 11 of the second metal layer.

In the representation of the first polygon data structure 12 shown in FIG. 3, the information about the interconnected polygons is configured in a structured and simply readable manner. In FIG. 3, rectangles are used to represent information about the individual polygons, each corresponding exactly to one polygon of the first integrated electric circuit 1.

Here, each rectangle is divided into a marking that states whether the relevant polygon is present, has been removed logically or is assigned to another polygon, into a shortened description of the relevant polygon and into a number which states at which level of the first integrated electric circuit 1 the relevant polygon is present.

Furthermore, the representation of the first polygon data structure 12 includes a large number of circular symbols that represent the contacts with which the polygons are interconnected. Furthermore, the representation of the first polygon data structure 12 includes a large number of arrows that represent the interconnections of the polygons.

According to the first exemplary embodiment, the first rectangle corresponds to the first polysilicon layer polygon 5. The marking "0" of the first polysilicon layer polygon 5 states that this polygon is present in the first integrated electric circuit 1. The shortened description "1. POLY" stands for the first polysilicon layer polygon 5. The number "2" from the representation of the first polysilicon layer polygon 5 states that the first polysilicon layer polygon 5 is disposed on the second level, namely the polysilicon layer.

Disposed on the right, beside the rectangular representation of the information about the first polysilicon layer polygon 5, is a circular symbol that illustrates the contact between the first polysilicon layer polygon 5 and the first metal layer polygon 9. Accordingly, there is a connection between the first polysilicon layer polygon 5 and the first metal layer polygon 9.

The first metal layer polygon 9 is present on the third level, namely the first metal layer, and is connected to two other polygons via two contacts. In this case, these are the first polysilicon layer polygon 5 and the third metal layer polygon 11.

The third metal layer polygon 11 is present on the fourth level, namely the second metal layer. It is connected to the first metal layer polygon 9 and to the third metal layer polygon 11.

The second metal layer polygon 10 is disposed on the first metal layer. Furthermore, it is connected to the third metal layer polygon 11, to the second diffusion layer polygon 3, and to the second polysilicon layer polygon 6.

The second diffusion layer polygon 3 is disposed on the diffusion layer and connected to the second metal layer polygon 10. The second polysilicon layer polygon 6 is disposed on the polysilicon layer and connected to the second metal layer polygon 10.

Figure 4:
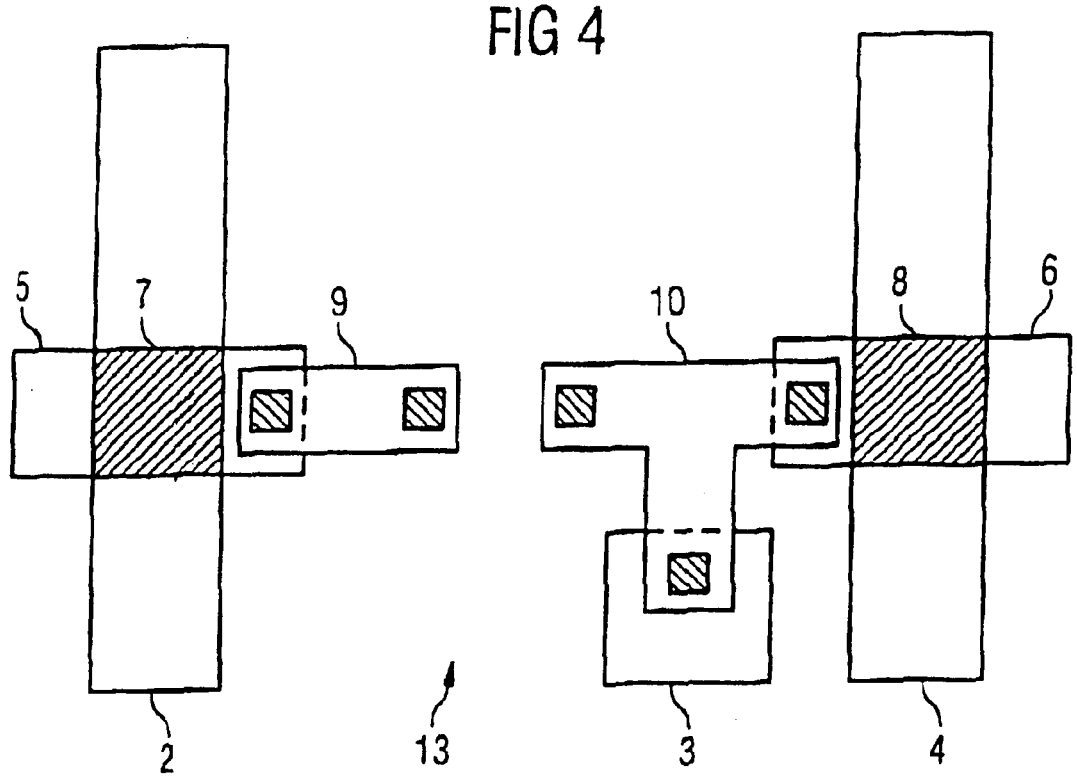
FIG. 4 is a plan view showing a second integrated electric circuit according to the first embodiment.

FIG. 4 shows a schematic two-dimensional representation of a plan view of a second integrated electric circuit 13 according to the first exemplary embodiment.

The second integrated electric circuit 13 includes a first diffusion layer polygon 2, a second diffusion layer polygon 3, a third diffusion layer polygon 4, a first polysilicon layer polygon 5, a second polysilicon layer polygon 6, a first transistor gate 7, a second transistor gate 8, a first metal layer polygon 9 and a second metal layer polygon 10.

The second integrated electric circuit 13 is divided into two separate regions. The first region of the second integrated electric circuit 13 includes the first diffusion layer polygon 2, the first polysilicon layer polygon 5, the first transistor gate 7, and the first metal layer polygon 9.

The second region of the second integrated electric circuit 13 is divided into the second diffusion layer polygon 3, the third diffusion layer polygon 4, the second polysilicon layer polygon 6, the second transistor gate 8, and the second metal layer polygon 10.

The representation of the second integrated electric circuit 13 in FIG. 4 is an image simulated on a computer system of a real integrated electric circuit. The information about the form and size of the individual polygons, and also the information about the circuit networks contained in the second integrated electric circuit 13 and having a large number of circuit elements, and their absolute and relative position in relation to one another, are stored in files on the storage unit of the computer system.

The construction and the representation of the second integrated electric circuit 13 from the information stored in the storage unit is carried out by a computer program.

The representation of the second integrated electric circuit 13 is an image of the real integrated electric circuit in the production process before the last fabrication step of the application of the third metal layer polygon 11.

Figure 5:
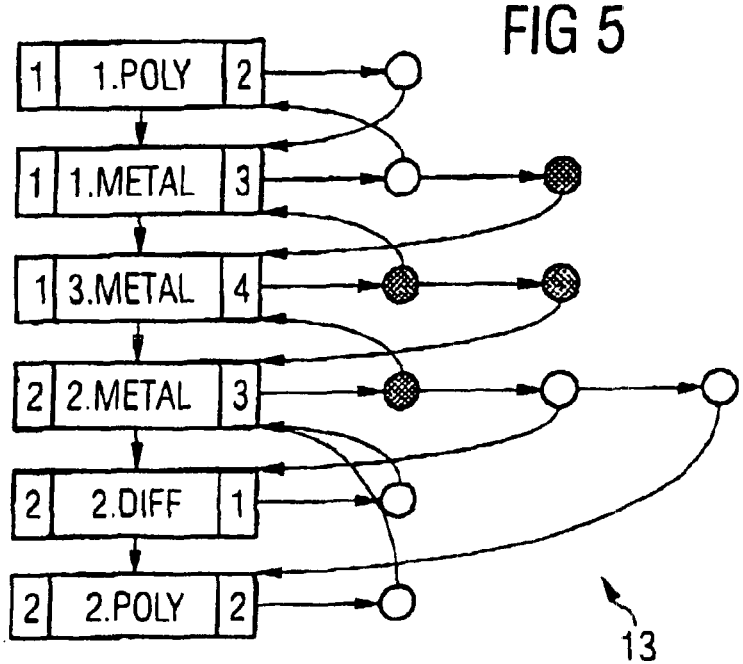
FIG. 5 is a schematic representation showing a second polygon data structure of the second integrated electric circuit according to the first embodiment shown in FIG. 4.

FIG. 5 shows a schematic representation of a second polygon data structure 14 of the second integrated electric circuit 13, shown in FIG. 4, according to the first exemplary embodiment.

The configuration of the polygons represented by the rectangles, the connections by arrows, and the contacts between the polygons of the second integrated electric circuit 13 by circular symbols, corresponds to the configuration of the first polygon data structure 12 shown in FIG. 3.

The third metal layer polygon 11 is not contained in the second integrated electric circuit 13. Accordingly, a marking "−1" is provided in the rectangle for representing information about the third metal layer polygon 11.

The first polysilicon layer polygon 5 and the first metal layer polygon 9, which belong to the first region of the second integrated electric circuit 13, have a marking "1". The second metal layer polygon 10, the second diffusion layer polygon 3, and the second polysilicon layer polygon 6 are disposed in the second region of the second integrated electric circuit 13. Accordingly, these three polygons have a marking "2" in FIG. 5.

All the contacts that are connected directly by arrows to the third metal layer polygon 11 are emphasized by hatching in FIG. 5. This means that these contacts do not provide any connection between polygons of the second integrated electric circuit 13.

The number that is contained in the rectangles in the representation of the second polygon data structure 14 shown in FIG. 5 states the level on which the relevant polygons are disposed. It corresponds in each case to the number in FIG. 3.

The first region of the second integrated electric circuit 13 includes the first metal layer polygon 9, which is connected directly to the first polysilicon layer polygon 5 containing the first transistor gate 7. The first region of the second integrated electric circuit 13 accordingly does not contain a "tie-down" diode.

The second metal layer polygon 10 is directly connected to the second polysilicon layer polygon 6 containing the second transistor gate 8. Furthermore, the second metal layer polygon 10 is connected directly to the second diffusion layer polygon 3. The connection between the second metal layer polygon 10 and the second diffusion layer polygon 3 constitutes a "tie-down" diode. Therefore, the second region of the second integrated electric circuit 13 has a "tie-down" diode.

In the following text, the method according to the invention of analyzing an integrated electric circuit is explained by using an exemplary embodiment.

During the production of integrated electric circuits, a plurality of fabrication steps are carried out one after another. One of these fabrication steps is the application of metallic layers. During or following the application of these metallic layers, it often occurs that these are charged electrically. If circuit elements or polygons of these electrically charged metallic layers are connected directly to a transistor gate and do not include a "tie-down" diode, by which they are connected to the diffusion layer, then a current flow may occur between the relevant circuit element or polygon and the transistor gate.

Instead of "tie-down" diodes, the checking of integrated electric circuits can also be carried out by using "antenna checks". In this case, specific predefined area relationships between two or more polygons, in particular metal polygons, and transistor gates have to be maintained.

If these area relationships are not maintained, undesired current flows can occur. Accordingly, in the method of the invention, the corresponding polygons are detected as faulty. If the corresponding area of the metal polygon is relatively small as compared with the area of the transistor gate, then no fault is detected. No destruction of the transistor occurs.

Accordingly, during the production process of formally correct integrated electric circuits, destruction of transistors can occur as a result of such undesired current flows. The result can be that complete integrated electric circuits become unusable.

In the method according to the invention, an image of an integrated electric circuit that is in complete working order is produced on the computer system. A check of the circuit network is then carried out to see whether the circuit network has a "tie-down" diode. If there is no such "tie-down" diode, then the relevant circuit or the relevant part of the circuit is output as faulty.

If there is such a "tie-down" diode, then a simulation relating to the individual fabrication steps of the production process is carried out. In this case, one fabrication step of the production process, in particular the respective last fabrication step in the sequence of fabrication steps, is selected. The circuit elements produced in this fabrication step are removed logically from the image of the integrated electric circuit on the computer system.

A renewed check is then carried out of the part or parts of the integrated electric circuit newly produced in this way for the presence of "tie-down" diodes.

In the first exemplary embodiment, the first integrated electric circuit 1 is selected, and an image of this is produced on the computer system. This image of the first integrated electric circuit 1 on the computer system is represented graphically both in FIG. 1 and in FIG. 2.

The second diffusion layer polygon 3 and the second metal layer polygon 10 constitute a "tie-down" diode. Accordingly, the check for the occurrence of a "tie-down" diode in the first integrated electric circuit 1 yields a positive result.

The extraction of the circuit network of the first integrated electric circuit 1 results in the first polygon data structure 12 illustrated in FIG. 3. This first polygon data structure 12 shows a coherent circuit network of the first integrated electric circuit 1. In this first polygon data structure 12, the various levels and therefore the successive fabrication steps of the production process of the first integrated electric circuit 1 can be seen.

In the exemplary embodiment the selection of the fourth level, namely the second metal layer, is carried out at this point. A new image of the second integrated electric circuit 13 is then produced on the computer system by the computer program, in which image the structure of the same integrated electric circuit is shown before the fabrication step of the application of the second metal layer.

In this case, the marking of all the polygons which are present on the second metal layer is set to "−1" or to "voided" in the second polygon data structure 14. In the exemplary embodiment, this is the third metal layer polygon 11.

Thus, in the exemplary embodiment, starting from the first integrated electric circuit 1 and leaving out the fabrication step of the application of the second metal layer, an image of the second integrated electric circuit 13 is produced on the computer system. The production of the second integrated electric circuit 13 is carried out on the basis of the second polygon data structure 14 in FIG. 5, in which the polygons to be left out and the connections between the existing polygons can be seen.

This second integrated electric circuit 13 has two mutually separate regions, which are checked one after another for the presence of a "tie-down" diode. In this case, the result for the first region of the second integrated electric circuit 13 is a fault message. The first metal layer polygon 9 is connected to the first transistor gate 7 and has no "tie-down" diode. Accordingly, the first region of the second integrated electric circuit 13 is detected as faulty by the method of the invention. The faulty first region of the second integrated electric circuit 13 is output on the computer system.

The second region of the second integrated electric circuit 13 has a "tie-down" diode in the form of the connection between the second diffusion layer polygon 3 and the second metal layer polygon 10. Thus, the second region of the second integrated electric circuit 13 corresponds to the checking in the exemplary embodiment.

Further simulation of the fabrication process of the second region of the second integrated electric circuit 13 will be left out in the exemplary embodiment.

Figure 6:
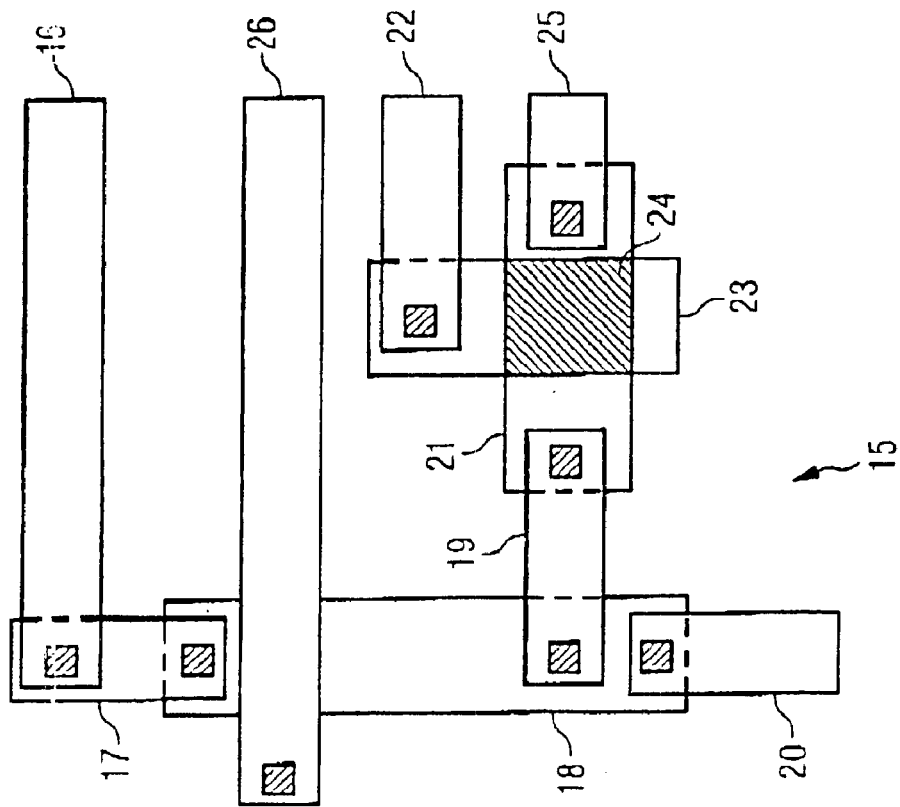
FIG. 6 is a plan view showing a third integrated electric circuit according to a second exemplary embodiment.

FIG. 6 shows a schematic two-dimensional representation of a plan view of a third integrated electric circuit 15 according to a second exemplary embodiment.

Figure 7:
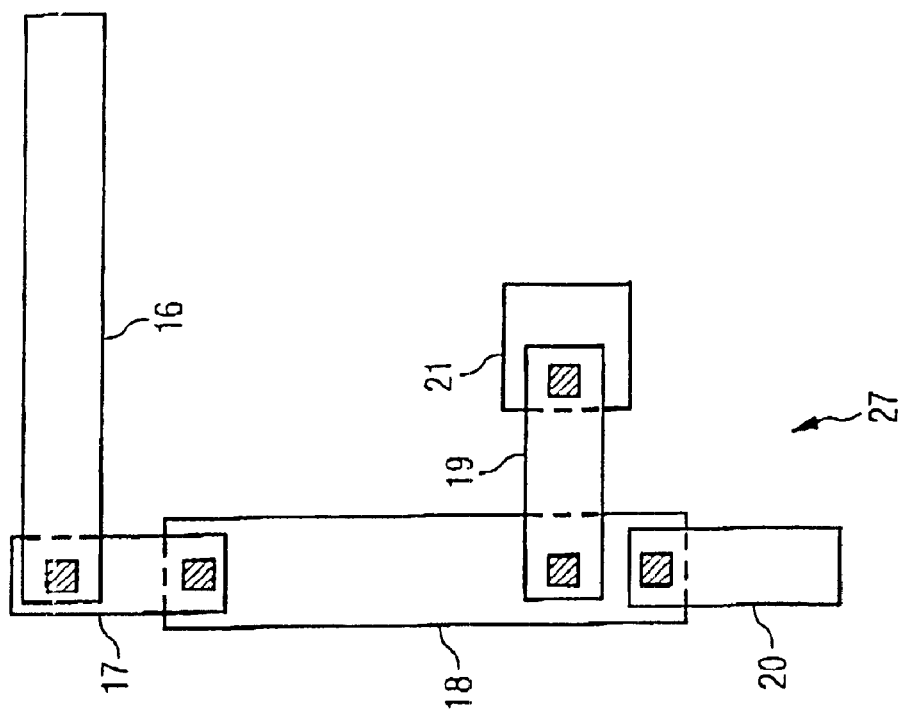
FIG. 7 is a plan view showing a first supply voltage network of the third integrated electric circuit 15, illustrated in FIG. 6, according to the second exemplary embodiment.

FIG. 7 shows a schematic two-dimensional representation of a plan view of a first supply voltage network 27 of the third integrated electric circuit 15, illustrated in FIG. 6, according to the second exemplary embodiment.

The representation of the third integrated electric circuit 15, shown in FIG. 6, and the representation of the first supply voltage network 27, shown in FIG. 7 is in each case an image simulated on a computer system of a real integrated electric circuit.

The third integrated electric circuit 15 includes the first supply voltage network 27, a further voltage network, an input voltage network, and an output voltage network. The third integrated electric circuit 15 constitutes a substantial simplification with respect to reality.

The first supply voltage network 27 is divided into a fourth metal layer polygon 16, a fifth metal layer polygon 17, a third polysilicon layer polygon 18, a sixth metal layer polygon 19, a seventh metal layer polygon 20, and a third diffusion layer polygon 21. The first supply voltage network 27 in FIG. 7 corresponds in terms of form and construction to the first supply voltage network 27 described in FIG. 6.

The further voltage network has a tenth metal layer polygon 26. In the exemplary embodiment, the further voltage network is wired via the first supply voltage network 27 and has no connection to the first supply voltage network 27.

The input voltage network includes an eighth metal layer polygon 22, a fourth polysilicon layer polygon 23 and a third transistor gate 24. The output voltage network includes a ninth metal layer polygon 25.

The third integrated electric circuit 15 is present on a diffusion layer, on a polysilicon layer, on a first metal layer and on a second metal layer. These layers are disposed one above another at a plurality of levels. In the present exemplary embodiment, the diffusion layer is constructed as the bottom layer. Above this there are the polysilicon layer, the first metal layer and the second metal layer.

The third diffusion layer polygon 21 is present on the diffusion layer. The third polysilicon layer polygon 18 of the first supply voltage network 27, and the fourth polysilicon layer polygon 23 of the input voltage network are disposed on the polysilicon layer. The fifth metal layer polygon 17, the sixth metal layer polygon 19 and the seventh metal layer polygon 20 of the first supply voltage network 27, the eighth metal layer polygon 22 of the input voltage network, the ninth metal layer polygon 25 of the output voltage network and the tenth metal layer polygon 26 of the further voltage network are present on the first metal layer. The fourth metal layer polygon 16 of the first supply voltage network 27 is present on the second metal layer.

The first supply voltage network 27 and the further voltage network are not interconnected in the exemplary embodiment. The input voltage network is connected to the output voltage network in the exemplary embodiment by using the third transistor gate 24. Both the input voltage network and the output voltage network are connected to the first supply voltage network 27 via the third diffusion layer polygon 21.

All the contacts that in each case interconnect two polygons are represented in the form of small squares in FIG. 6 and in FIG. 7.

The fourth metal layer polygon 16 is connected to the fifth metal layer polygon 17 by a contact. The fifth metal layer polygon 17 is connected to the fourth metal layer polygon 16 and to the third polysilicon layer polygon 18 by a contact in each case. The third polysilicon layer polygon 18 is linked to the fifth metal layer polygon 17, to the sixth metal layer polygon 19, and to the seventh metal layer polygon 20 by a contact in each case. The sixth metal layer polygon 19 is connected to the third polysilicon layer polygon 18 and to the third diffusion layer polygon 21 by a contact in each case. The seventh metal layer polygon 20 is connected to the third polysilicon layer polygon 18 via a contact. The third diffusion layer polygon 21 is connected to the sixth metal layer polygon 19 and to the ninth metal layer polygon 25 by a contact in each case, and to the fourth polysilicon layer polygon 23 via the third transistor gate 24. The eighth metal layer polygon 22 is connected to the fourth polysilicon layer polygon 23 by a contact. The ninth metal layer polygon 25 is connected to the third diffusion layer polygon 21 by a contact.

In the present second exemplary embodiment, the first supply voltage network 27 is wrongly wired. In an ideal construction of the first supply voltage network 27 of the third integrated electric circuit 15, a metal layer polygon is provided instead of the third polysilicon layer polygon 18.

According to FIGS. 6 and 7, the third polysilicon layer polygon 18 is provided as a conductive connecting element. Polysilicon is a conductive material, but the conductivity of poly-silicon is substantially lower than the conductivity of metal.

During the production of an image of the third integrated electric circuit 15 on the computer system from the data stored in the storage unit of the computer system, the third polysilicon layer polygon 18 is recognized as a conductive element. Accordingly, the image of the third integrated electric circuit 15 according to FIG. 6 is produced with the third polysilicon layer polygon 18. No checking of the value of the conductivity of the individual polygons takes place. Accordingly, faulty polygons, which have a significantly lower conductivity than that desired, are not detected during the extraction.

Accordingly, in the present second exemplary embodiment, the transistor, which is divided into the third diffusion layer polygon 21, the fourth polysilicon layer polygon 23 and the third transistor gate 24, will with high probability be constructed as faulty.

Figure 8:
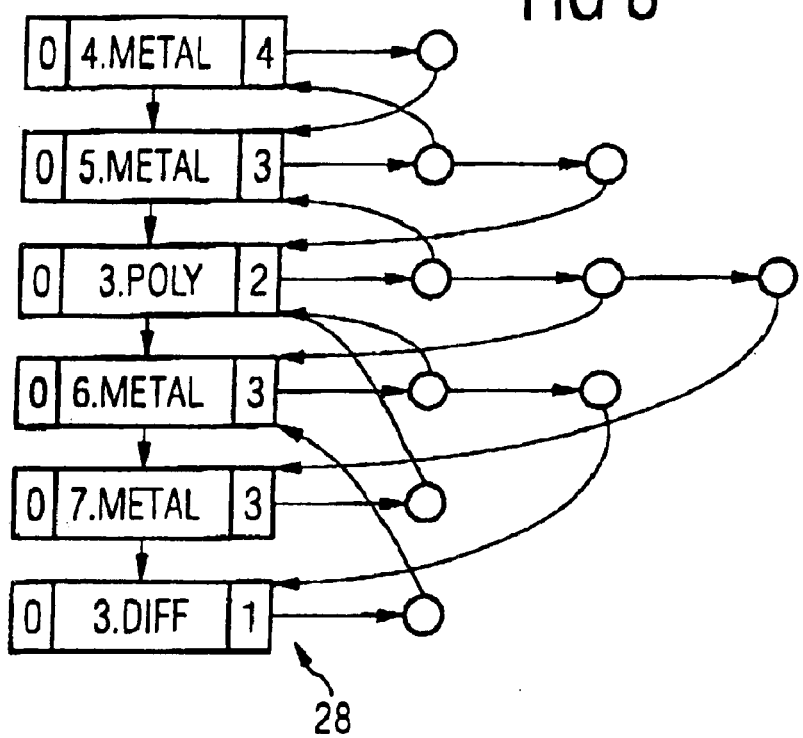
FIG. 8 is a schematic representation showing a third polygon data structure 28 of the first supply voltage network 27, shown in FIG. 7, of the third integrated electric circuit 15 according to the second exemplary embodiment.

FIG. 8 shows a schematic representation of a third polygon data structure 28 of the first supply voltage network 27, shown in FIGS. 6 and 7, of the third integrated electric circuit 15 according to the second exemplary embodiment.

The representation of the third polygon data structure 28 has a representation of information about the fourth metal layer polygon 16, the fifth metal layer polygon 17, the third polysilicon layer polygon 18, the sixth metal layer polygon 19, the seventh metal layer polygon 20, and the third diffusion layer polygon 21. In this case, the polygons are those of the first supply voltage network 27.

With regard to the representation of the information, the third polygon data structure 28 in FIG. 8 corresponds to the first polygon data structure in FIG. 3 and the second polygon data structure in FIG. 5.

In the second exemplary embodiment, the first rectangle corresponds to the fourth metal layer polygon 16. The marking "0" of the fourth metal layer polygon 16 states that this polygon is present in the first supply voltage network 27 of the third integrated electric circuit 15. The abbreviated description "4.Metall" stands for the fourth metal layer polygon 16. The number "4" of the representation of the fourth metal layer polygon 16 refers to the fourth level of the third integrated electric circuit 15, on which the fourth metal layer polygon 16 is disposed, to be specific, the second metal layer. The circular symbol, which is disposed beside the rectangle "4.Metall", represents the connection between the fourth metal layer polygon 16 and the fifth metal layer polygon 17.

The fifth metal layer polygon 17 is present on the third level. In this case, it is the first metal layer. It is connected to the fourth metal layer polygon 16 and the third polysilicon layer polygon 18.

The third polysilicon layer polygon 18 is present on the second level, namely the polysilicon layer. It is connected to the fifth metal layer polygon 17, to the sixth metal layer polygon 19, and to the seventh metal layer polygon 20.

The sixth metal layer polygon 19 is present on the third level, to be specific the first metal layer, and is connected to the third polysilicon layer polygon 18 and to the third diffusion layer polygon 21.

The seventh metal layer polygon 20 is present on the third level, namely the first metal layer. It is connected to the third polysilicon layer polygon 18.

The third diffusion layer polygon 18 is present on the first level, namely the diffusion layer. It is connected to the sixth metal layer polygon 19.

Figure 9:
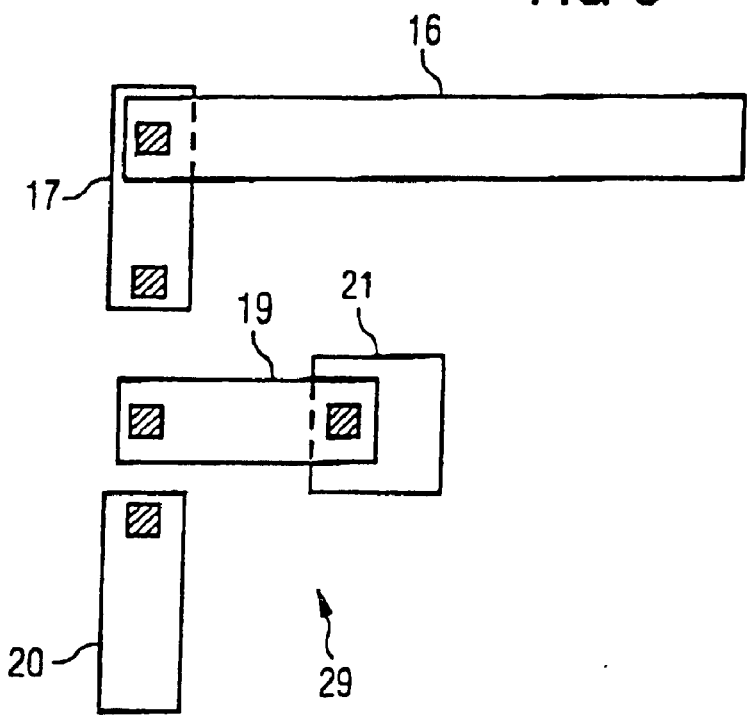
FIG. 9 is a plan view showing a second supply voltage network of the third integrated electric circuit according to the second exemplary embodiment.

FIG. 9 shows a schematic two-dimensional representation of a plan view of a second supply voltage network 29 of the third integrated electric circuit 15 according to the second exemplary embodiment.

The second supply voltage network 29 is divided into the fourth metal layer polygon 16, the fifth metal layer polygon 17, the sixth metal layer polygon 19, the seventh metal layer polygon 20, and the third diffusion layer polygon 21.

Accordingly, the second supply voltage network 29 includes a first region with the fourth metal layer polygon 16 and with the fifth metal layer polygon 17, a second region with the sixth metal layer polygon 19 and with the third diffusion layer polygon 21, and a third region with the seventh metal layer polygon 20. These three regions are not interconnected.

The representation of the second supply voltage network 29 in FIG. 9 is an image simulated on a computer system of a real integrated electric circuit. The second supply voltage network 29 in FIG. 9 corresponds to the first supply voltage network 27 in FIG. 7, the third polysilicon layer polygon 18 not being present in the representation of the second supply voltage network 29.

Figure 10:
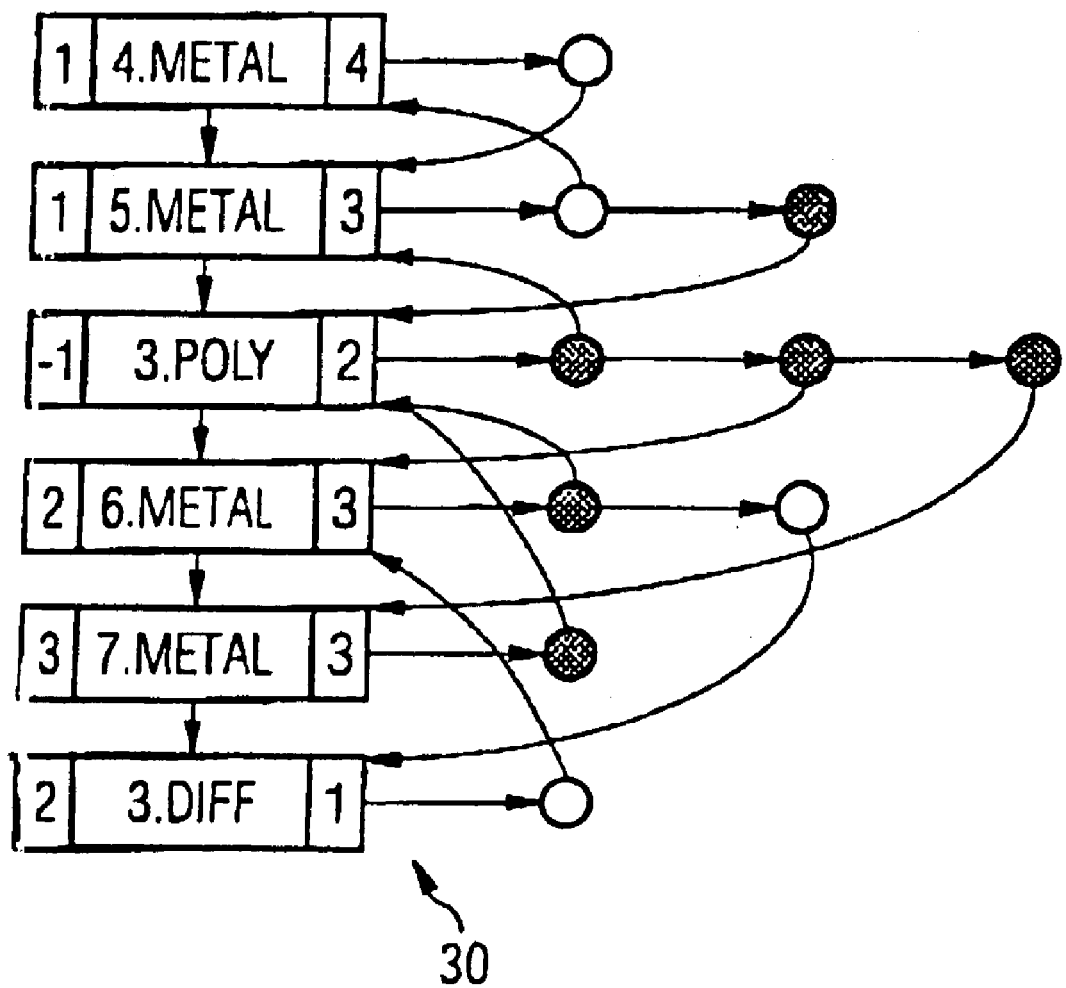
FIG. 10 is a schematic representation of a fourth polygon data structure of the second supply voltage network, shown in FIG. 9, according to the second exemplary embodiment.

FIG. 10 shows a schematic representation of a fourth polygon data structure 30 of the second supply voltage network 29, shown in FIG. 9, according to the second exemplary embodiment.

With regard to the representation of the information, the fourth polygon data structure 30 in FIG. 10 corresponds to the first polygon data structure 12 in FIG. 3, the second polygon data structure 14 in FIG. 5 and the third polygon data structure 28 in FIG. 8. The configuration of the fourth metal layer polygon 16, of the fifth metal layer polygon 17, of the third polysilicon layer polygon 18, of the sixth metal layer polygon 19, of the seventh metal layer polygon 20 and of the third diffusion layer polygon 21 agrees with the configuration of the third polygon data structure 28 that is shown in FIG. 8.

The third polysilicon layer polygon 18 is not included in the second supply voltage network 29, according to FIG. 9. Accordingly, the rectangle of the third polysilicon layer polygon 18 in FIG. 10 has a marking "−1". All the contacts which represent a direct connection to the third polysilicon layer polygon 18 not contained in the second supply voltage network 29 are represented in FIG. 10 by filled circular symbols. These symbols are connected by arrows in each case to the third polysilicon layer polygon 18 and the corresponding further polygons.

Those contacts that represent an intact connection between the respective polygons are represented by circular symbols filled with white. These symbols are connected by using arrows to those polygons between which they are disposed in the second supply voltage network 29.

The fourth metal layer polygon 16 and the fifth metal layer polygon 17 are interconnected by a contact. These two polygons constitute the first region of the second supply voltage network 29. Accordingly, there is in each case a marking "1" contained in the rectangle of the fourth metal layer polygon 16 and in the rectangle of the fifth metal layer polygon 17 in the fourth polygon data structure 30.

The sixth metal layer polygon 19 and the third diffusion layer polygon 21 are interconnected by a contact. These two polygons constitute the separate second region of the second supply voltage network 29. The rectangle of the sixth metal layer polygon 19 and the rectangle of the third diffusion layer polygon 21 thus in each case contain a marking "2".

The seventh metal layer polygon 20 constitutes the separate third region of the second supply voltage network 29. The seventh metal layer polygon 20 is not connected to other polygons by any kind of contacts. Accordingly, the rectangle of the fourth polygon data structure 30 in FIG. 10 has a marking "3".

In the following text, the method according to the invention for analyzing an integrated electric circuit is explained using the second exemplary embodiment.

In the production of integrated electric circuits, conductive layers are applied to the relevant semiconductor substrate. In this case, different layers, in particular metal layers and polysilicon layers, exhibit different conductivities. Metal layers are as a rule substantially more conductive than polysilicon layers. If parts of integrated electric circuits, in particular power and ground lines, are connected to high-resistance polysilicon layer polygons, in particular troughs, instead of metal layer polygons, then the functionality of the real integrated electric circuit deviates from the planned functionality.

In the simulation of integrated electric circuits on a computer system, no statements about the value of the conductivity of different polygons are provided. There is merely a definition as to whether a polygon is constructed to be conductive or nonconductive.

In the method according to the invention, an image of a complete integrated electric circuit is produced on the computer system. Then, a level or a layer of the integrated electric circuit, in particular a polysilicon layer, is selected by a user.

Starting from the image of the integrated electric circuit, a new image of the integrated electric circuit is produced, the polygons of the selected layer of the integrated electric circuit being removed from the original image of the integrated electric circuit.

There then follows a check on the newly produced image of the integrated electric circuit, to see whether this image is coherent or whether, as a result of leaving out polygons, a plurality of mutually separate regions of the integrated electric circuit have been produced.

If the image produced in this way of the integrated electric circuit is coherent, then the steps of selecting a layer and producing a new image of the integrated electric circuit by omitting the polygons disposed on a layer to be selected are repeated. This repetition is carried out for further layers, in particular for each polysilicon layer, until the respectively newly produced image of the integrated electric circuit includes a plurality of separate regions or until no further layers are selected.

If an image is found of the integrated electric circuit to be tested which contains a plurality of separate not interconnected regions of polygons, then this image is output, as is the associated information, in particular about the last selected layer.

In the present second exemplary embodiment, at the start, the first supply voltage network 27 of the third integrated electric circuit 15 is selected, and an image of this first supply voltage network 27 is produced on the computer system from the information present in the storage unit of the computer system. This image of the first supply voltage network 27 on the computer system is represented graphically both in FIGS. 6 and 7.

Information about the form and size of the individual polygons and information about the absolute and relative configuration of the individual polygons in relation to one another within the third integrated electric circuit 15 are contained in the storage unit of the computer system.

Then, a user selects the polysilicon layer on which the third polysilicon layer polygon 18 is present.

The first supply voltage network 27 is coherent. This can be seen from the fact that all the polygons in the third polygon data structure 28 corresponding to the first supply voltage network 27 bear the marking "0" in FIG. 8. This marking "0" states that the respective polygons are contained in the first supply voltage network 27.

Then, a new image of the first supply voltage network 27 is produced, in which all the polygons that are disposed on the polysilicon layer have been omitted. In the present second exemplary embodiment, the third polysilicon layer polygon 18 is accordingly omitted.

The image formed in this way from the first supply voltage network 27 is illustrated in FIG. 9. This is the second supply voltage network 29. From the second supply voltage network 29 and from the fourth polygon data structure 30 in FIG. 10, corresponding to the second supply voltage network 29, it can be seen that the second supply voltage network 29 is not coherent. It includes a plurality of not interconnected regions and has therefore been "broken up".

The marking "−1" of the third polysilicon layer polygon 18 in the fourth polygon data structure 30 states that this polygon has been "voided" or "removed".

All the polygons that are interconnected with the same polygon in a region of the second supply voltage network 29 are combined. This step is carried out "bottom-up" and determines the minimum number of polygons for each region of the second supply voltage network 29.

In the present second exemplary embodiment, the fourth metal layer polygon 16 is connected to the fifth metal layer polygon 17. No further polygons are connected directly to these two polygons. Accordingly, in the fourth polygon data structure 30, in each case a marking "1" is entered into the rectangle of the fourth metal layer polygon 16 and the rectangle of the fifth metal layer polygon 17. This marking indicates the first region of the second supply voltage network 29.

The sixth metal layer polygon 19 is connected to the third diffusion layer polygon 21. Accordingly, in each case a marking "2" is entered into the rectangle of the sixth metal layer polygon 19 and the rectangle of the third diffusion layer polygon 21 in the fourth polygon data structure 30. This indicates that these are polygons belonging to the second region of the second supply voltage network 29.

The seventh metal layer polygon 20 is isolated there and is not connected to any other polygon. Accordingly, the seventh metal layer polygon 20 constitutes the third region of the second supply voltage network 29. This is indicated in the fourth polygon data structure 30 in FIG. 10 by entering the marking "3" in the rectangle of the seventh metal layer polygon 20.

In the second supply voltage network 29, there are no further connections between polygons. The second supply voltage network 29 has therefore been broken down into three separate regions.

As a result of this check it is determined that the three identified separate regions of the second supply voltage network 29 are connected exclusively via the high-resistance third polysilicon layer polygon 19 which, although it is conductive, has a substantially higher electrical resistance than that desired.

There then follows an output of the second supply voltage network 29 and further information, such as statements about the polysilicon layer removed during the check, in particular about the third polysilicon layer polygon 18. Using the information obtained in this way, correction of the third integrated electric circuit 15 is possible.

The second exemplary embodiment is completed at this point.

We claim:

1. A method for analyzing integrated electric circuits, which comprises the following steps:
   a) providing a circuit network having circuit elements, the circuit elements being determined by form, property information, and position information selected from a group consisting of absolute position and relative position within the circuit network; the form, property information, and the position information being stored in at least a part of a file on a storage unit of a computer system, and the circuit elements of the integrated electric circuit being produced serially in a production including successive product on steps;
   b) selecting at least a part of the circuit network;
   c) producing an image of the at least a part of the circuit network selected in step b) on the computer system, from the information stored in the storage unit regarding the circuit elements of the at least part of the circuit network;
   d) producing on the computer system at least one circuit-network image of at least one new circuit network by starting from the produced image from step c) of the at least part of the circuit network and removing information from the produced image about circuit elements being produced in a same production step and in successive production steps of the production process;
   e) checking the at least one circuit-network image produced in step d) of the circuit networks for correctness by using predefined testing rules to determine faults; and
   f) individually marking the at least one circuit-network image when the at least one circuit-network image contains a fault determined in step e).

2. The method according to claim 1, which further comprises forming only one new coherent circuit network in step d).

3. The method according to claim 2, which further comprises, after step f), carrying out step g1):
   g1) repeating steps d), e) and f) until either, in step e), the checking of the image produced in step d) of the circuit networks for correctness by using predefined testing rules supplies a negative result or until, in step d), no further circuit elements produced in a same production step can be omitted.

4. The method according to claim 3, which further comprises, after step f) or g1), carrying out step h3):
   h3) improving the circuit elements having information omitted in step d) by using correction rules.

5. The method according to claim 1, which further comprises forming at least two mutually separate circuit networks in step d).

6. The method according to claim 5, which further comprises supplying a faulty result during step e) of the at least one circuit-network image produced in step d).

7. The method according to claim 6, which further comprises replacing step d) with step d3):
   d3) producing on the computer system at least one circuit-network image by starting from the produced image of the at least part of the circuit network and omitting information about circuit elements produced in the same production step of the production process and formed from polysilicon.

8. The method according to claim 7 which further comprises, after step f):
   h5) replacing the circuit elements having information omitted in step d3) with circuit elements including metal when, in step d3), a plurality of images of new mutually separate circuit networks has been produced.

9. The method according to claim 1, which further comprises outputting information individually identifying the at least one circuit-network image when the at least one circuit-network image has been marked in step f).

10. The method according to claim 1, which further comprises after step f):
    g) repeating steps d), e), and f) until, in step d), no further information can be omitted about circuit elements produced in the same production step of the production process when the at least one circuit-network image has no faults; and replacing step d) with step d1) upon repetition of steps c), d), and e):
    d1) producing on the computer system the circuit-network image of at least one new circuit network, by starting from the respectively last produced circuit-network image and omitting information about circuit elements produced in respectively next and a last production step of the production process.

11. The method according to claim 1, which further comprises:
    h) improving the circuit-network images, marked in step e), of the faulty circuit networks by using predefined correction rules when circuit-network images of faulty circuit networks are marked in step f).

12. The method according to claim 1, which further comprises supplying a fault result in step e) when the circuit element is metallic and connected to a gate of a transistor and not to a tie-down diode.

13. The method according to claim 12, which further comprises connecting the metallic circuit element directly to the gate of the transistor.

14. The method according to claim 12, which further comprises connecting the metallic circuit element to the gate of the transistor via at least one further metallic circuit elements.

15. The method according to claim 12, which further comprises, when, in step e), the circuit-network image was marked for including the metallic circuit element connected to the gate of a transistor and not to the tie-down diode, after step f), carrying out step h1):
    h1) changing the information about the circuit elements, by connecting the relevant metallic circuit element to the tie-down diode in the image of the relevant circuit network.

16. The method according to claim 12, which further comprises, when, in step f), a faulty circuit-network image was marked for including the metallic circuit element connected to the gate of a transistor and not connected to the tie-down diode, carrying out after step f) step h2):
    h2) changing the information about the circuit elements, by connecting the metallic circuit element connected to he relevant gate of the transistor to the tie-down diode in the image of the relevant circuit network.

17. The method according to claim 1, which further comprises replacing step d) with step d2):
    d2) producing on the computer system at least one coherent-circuit image by starting from the produced image of the at least part of the circuit network from the information being omitted about circuit elements produced in the same production step of the production process and having a high electrical resistance.

18. The method according to claim 17, which further comprises, after step f) or g1), carrying out step h4):
    h4) replacing the circuit elements having information omitted in step d2) with circuit elements having lower electrical resistances when, in step d2), a plurality of images of new mutually separated circuit networks has been produced.

19. A computer program for executing a method that comprises the following steps:
    a) selecting at least a part of a circuit network from a storage unit, the circuit network having a large number of circuit elements, the circuit elements being determined by form, property information, and position information selected from a group consisting of absolute position and relative position within the circuit network; the form, property information, and position information being stored in at least a part of a file on a storage unit of a computer system, and the circuit elements of the integrated electric circuit being produced one after another in a production process by a large number of successive production steps;
    b) producing an image of the at least a part of the circuit network selected in step a) on the computer system, from the information stored in the storage unit regarding the circuit elements of the at least part of the circuit network;
    c) producing on the computer system at least one circuit-network image of a new coherent circuit network or new mutually separate circuit networks by starting from the produced image of the at least part of the circuit network and removing information from the produced image about circuit elements being produced in a same production step and in successive production steps of the production process;
    d) checking the image produced in step c) of the circuit networks for correctness by using predefined testing rules to determine faults; and
    e) individually marking the at least one circuit-network image when the at least one circuit-network contains fault determined in step d).

20. The computer program according to claim 19, which is storable on a storage medium.

21. The computer program according to claim 19, which is storable in a computer memory.

22. The computer program according to claim 19, which is storable in a direct access memory.

23. The computer program according to claim 19, which is transmittable on an electrical carrier signal.

24. A data carrier, comprising: a computer program, the program executing a method that includes:
    a) selecting at least a part of a circuit network from a storage unit, the circuit network having a large number of circuit elements, the circuit elements being determined by form, property information, and position information selected from a group consisting of absolute position and relative position within the circuit network; the form, property information, and position information being stored in at least a part of a file on a storage unit of a computer system, and the circuit elements of the integrated electric circuit being produced one after another in a production process by a large number of successive production steps;
    b) producing an image of the at least a part of the circuit network selected in step a) on the computer system, from the information stored in the storage unit regarding the circuit elements of the at least part of the circuit network;

c) producing on the computer system at least one circuit-network image of a new coherent circuit network or new mutually separate circuit networks by starting from the produced image of the at least part of the circuit network and removing information from the produced image about circuit elements being produced in a same production step and in successive production steps of the production process;

d) checking the image produced in step c) of the circuit networks for correctness by using predefined testing rules to determine faults; and e) individually marking the at least one circuit-network image when the at least one circuit-network contains a fault determined in step d).

25. A method, which comprises downloading a computer program from an electronic data network onto a computer connected to the electronic data network, the program executing a method that includes:

a) selecting at least a part of a circuit network from a storage unit, the circuit network having a large number of circuit elements, the circuit elements being determined by form, property information, and position information selected from a group consisting of absolute position and relative position within the circuit network; the form, property information, and position information being stored in at least a part of a file on a storage unit of a computer system, and the circuit elements of the integrated electric circuit being produced one after another in a production process by a large number of successive production steps;

b) producing an image of the at least a part of the circuit network selected in step a) on the computer system, from the information stored in the storage unit regarding the circuit elements of the at least part of the circuit network;

c) producing on the computer system at least one circuit-network image of a new coherent circuit network or new mutually separate circuit networks by starting from the produced image of the at least part of the circuit network and removing information from the produced image about circuit elements being produced in a same production step and in successive production steps of the production process;

d) checking the image produced in step c) of the circuit networks for correctness by using predefined testing rules to determine faults; and e) individually marking the at least one circuit-network image when the at least one circuit-network contains a fault determined in step d).

26. The method according to claim 25, wherein the electronic data network is the Internet.

* * * * *

UNITED STATES PATENT AND TRADEMARK OFFICE
CERTIFICATE OF CORRECTION

PATENT NO. : 6,892,364 B2  
DATED : May 10, 2005  
INVENTOR(S) : Peter Baader et al.

Page 1 of 1

It is certified that error appears in the above-identified patent and that said Letters Patent is hereby corrected as shown below:

Column 21,
Line 61, should read as follows:
-- the relevant gate of the transistor to the tie-down diode --.

Signed and Sealed this

Thirtieth Day of August, 2005

JON W. DUDAS
*Director of the United States Patent and Trademark Office*